US009942988B2

(12) United States Patent
Kitatani et al.

(10) Patent No.: US 9,942,988 B2
(45) Date of Patent: Apr. 10, 2018

(54) CIRCUIT BOARD AND POWER SUPPLY APPARATUS

(71) Applicant: TDK Corporation, Tokyo (JP)

(72) Inventors: Kazuharu Kitatani, Tokyo (JP); Yasunobu Noguchi, Tokyo (JP)

(73) Assignee: TDK Corporation (JP)

( * ) Notice: Subject to any disclaimer, the term of this patent is extended or adjusted under 35 U.S.C. 154(b) by 0 days.

(21) Appl. No.: 15/281,340

(22) Filed: Sep. 30, 2016

(65) Prior Publication Data

US 2017/0105285 A1 Apr. 13, 2017

(30) Foreign Application Priority Data

Oct. 7, 2015 (JP) ................................. 2015-199017

(51) Int. Cl.
| | |
|---|---|
| H05K 7/00 | (2006.01) |
| H05K 1/18 | (2006.01) |
| H05K 1/11 | (2006.01) |
| H05K 3/34 | (2006.01) |

(52) U.S. Cl.
CPC .............. *H05K 1/181* (2013.01); *H05K 1/11* (2013.01); *H05K 3/34* (2013.01); *H05K 2201/09072* (2013.01); *H05K 2201/10015* (2013.01); *H05K 2201/10257* (2013.01); *H05K 2201/10272* (2013.01)

(58) Field of Classification Search
CPC ........................... H05K 1/0201; H05K 1/0263
USPC ........ 361/611, 624, 637, 639, 648–650, 760, 361/775; 439/76.1
See application file for complete search history.

(56) References Cited

U.S. PATENT DOCUMENTS

| | | | | |
|---|---|---|---|---|
| 6,473,291 | B1 * | 10/2002 | Stevenson .............. | H01G 4/228 361/301.4 |
| 8,624,122 | B2 * | 1/2014 | Shiraiwa .............. | H05K 1/0201 174/250 |
| 2006/0092599 | A1 * | 5/2006 | Yamamura ........... | H05K 1/0263 361/611 |
| 2009/0294195 | A1 * | 12/2009 | Otsuka ................... | B60K 6/405 180/65.275 |
| 2013/0266826 | A1 * | 10/2013 | Cowperthwaite ........ | H01G 9/28 429/7 |

FOREIGN PATENT DOCUMENTS

JP 2011-258612 A 12/2011

* cited by examiner

*Primary Examiner* — Tuan T Dinh
(74) *Attorney, Agent, or Firm* — Harness, Dickey & Pierce, P.L.C.

(57) ABSTRACT

A circuit board includes a base substrate, a busbar disposed on a mounting surface of the base substrate; and an electronic component disposed on the mounting surface and including a plurality of terminals. At least one of the terminals is soldered to a component connecting end portion extending from the busbar. The base substrate has an opening into which the component connecting end portion is inserted. A first insertion portion is provided in the component connecting end portion. The terminal is inserted through the first insertion portion. The busbar is fixed to the base substrate so that the component connecting end portion is inserted into the opening with a soldering surface positioned closer to a rear surface of the base substrate than the component mounting surface. The soldering surface is on a side of the component connecting end portion where the terminal inserted through the first insertion portion protrudes.

4 Claims, 3 Drawing Sheets

CIRCUIT BOARD AND POWER SUPPLY APPARATUS

CROSS-REFERENCE TO RELATED APPLICATION

This application claims priority to Japanese Patent Application No. 2015-199017 filed Oct. 7, 2015 which is hereby expressly incorporated by reference herein in its entirety.

FIELD OF THE INVENTION

The present invention relates to a circuit board where a busbar and electronic components are mounted on a base substrate and to a power supply apparatus equipped with this type of circuit board.

DESCRIPTION OF THE RELATED ART

The Japanese Laid-open Patent Publication No. 2011-258612 discloses a circuit board where a busbar and electronic components are mounted on a substrate. Note that in the following description, a substrate on which electronic components and the like are to be mounted is referred to as a "base substrate" to facilitate distinction between itself and the expression "circuit board", which here refers to a substrate on which electronic components have been mounted.

The above circuit board has hole portions formed in the base substrate so as to expose peripheral parts of lead introducing holes of a busbar attached to the base substrate and also expose leads (connection terminals) of electronic components that have been inserted through the lead introducing holes. With a circuit board of this configuration, it is possible, when leads of other electronic components to be directly mounted onto the base substrate (i.e., leads that are inserted through lead introducing holes provided in the base substrate and whose front ends protrude from the rear surface side of the base substrate) are soldered to the base substrate by dip soldering, to solder leads that have been inserted through the lead introducing holes to the busbar by introducing solder into hole portions from the rear surface side of the base surface.

SUMMARY OF THE INVENTION

However, the circuit board disclosed in the cited patent document has the following problem to be solved. That is, with the circuit board disclosed in the cited patent document, hole portions are provided in the base substrate and during dip soldering, solder is introduced into the hole portions from the rear surface side of the base substrate. With this configuration, leads of electronic components are soldered to a busbar provided on the component mounting surface side of the base surface.

Here, to achieve sufficient physical strength, the base substrate of a circuit board that constructs a power supply apparatus or the like needs to have a certain thickness. This means that if the hole portions provided in the base substrate are too small (too narrow), it is not possible to sufficiently supply the amount of solder needed for soldering from the rear surface side of the base substrate to the busbar that is provided on the component mounting surface side of the base substrate and to the leads that have been inserted through the lead insertion holes of the busbar. This results in the risk of poor soldering of leads to the busbar.

On the other hand, by providing sufficiently large (sufficiently wide) hole portions in the base substrate, it will be possible to reliably supply a sufficient amount of solder from the rear surface side of the base substrate to the busbar and the leads, even if the base substrate is quite thick. However, if the hole portions are too large (too wide), it becomes difficult to miniaturize the base substrate due to the inability to form a wiring pattern or the like at the parts where the hole portions are formed, and there is the further risk of a drop in the physical strength of the base substrate.

The present invention was conceived in view of the problem described above and has a principal object of providing a circuit board and a power supply apparatus where it is possible to reliably solder connection terminals onto a busbar without leading to a drop in the physical strength of the base substrate or an increase in size of the base substrate.

To achieve the stated object, a circuit board according to the present invention comprises a base substrate; a busbar disposed on a component mounting surface side of the base substrate; and an electronic component that is disposed on the component mounting surface side of the base substrate and has a plurality of connection terminals, at least one of which is soldered to a component connecting end portion that extends from a base portion of the busbar, wherein the base substrate is provided with an opening portion into which the component connecting end portion is capable of being inserted, a first insertion portion through which the connection terminal can be inserted is provided in the component connecting end portion, and the busbar is fixed to the base substrate in a state where the component connecting end portion has been inserted into the opening portion with a soldering surface, which is located on a side of the component connecting end portion where the connection terminal that has been inserted through the first insertion portion protrudes (the surface to be soldered the connection terminal that has been inserted through the first insertion portion from the rear surface side of the component mounting surface on the base substrate), is positioned closer to a rear surface side of the base substrate than the component mounting surface of the base substrate. Also, a power supply apparatus according to the present invention comprises the circuit board described above.

Accordingly, according to the circuit board and the power supply apparatus according to the present invention, even when the thickness of the base substrate has been made sufficiently thick to ensure sufficient physical strength, by positioning the soldering surfaces of the component connecting end portions and the component connecting end portions closer to the rear surface side than the component mounting surface of the base substrate, it is possible, without forming excessively large opening portions, to reliably supply a sufficient amount of solder to the connection terminals that have been inserted through the opening portions and the soldering surfaces of the component connecting end portions. By doing so, it is possible to quickly and reliably solder the connection terminals to the component connecting end portions without causing a drop in the physical strength of the base substrate, and as a result, it is possible to supply the circuit board and the power supply apparatus where the connection terminals have been reliably soldered. Since large opening portions are unnecessary, there is a corresponding increase in the area of the region where it is possible to form wiring patterns on the base substrate, which means that it is also possible to sufficiently miniaturize the base substrate (the circuit board).

Also, the circuit board according to the present invention comprises the busbar including a first busbar that has one out of the plurality of connection terminals of the electronic component soldered to the component connecting end portion and a second busbar that has another out of the plurality of connection terminals soldered to the component connecting end portion, and a second insertion portion is provided on one out of the first busbar and the second busbar, with the other connection terminal to be soldered to the component connecting end portion being inserted through the second insertion portion.

According to the circuit board and the power supply apparatus according to the present invention, it is possible to dispose the busbars so that the periphery of the second insertion portion in the base portion of one busbar and the periphery of the first insertion portion in the component connecting end portion of the other busbar are coincident in the thickness direction of the base substrate, which means that it is possible to make effective use of the mounting area of the base substrate, and as a result, it is possible to significantly miniaturize the base substrate.

It should be noted that the disclosure of the present invention relates to the contents of Japanese Patent Application 2015-199017 that was filed on Oct. 7, 2015, the entire contents of which are herein incorporated by reference.

BRIEF DESCRIPTION OF THE DRAWINGS

These and other objects and features of the present invention will be explained in more detail below with reference to the attached drawings, wherein.

DESCRIPTION OF THE PREFERRED EMBODIMENTS

Preferred embodiments of a circuit board and a power supply apparatus are described below with reference to the attached drawings.

Figure 1:
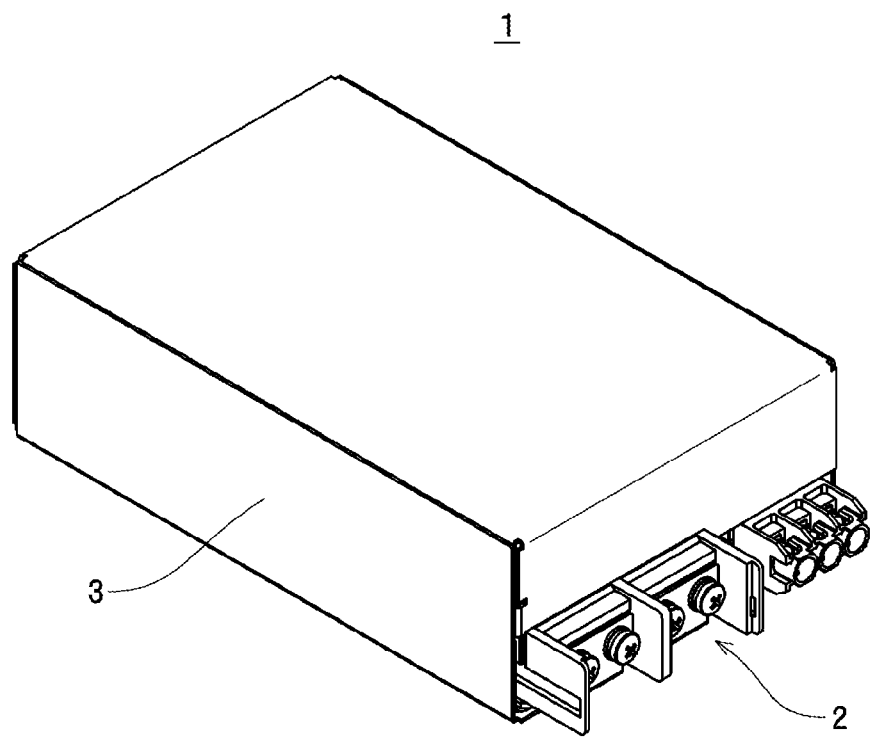
FIG. 1 is a perspective view of a power supply apparatus.

A power supply apparatus 1 depicted in FIG. 1 is one example of a "power supply apparatus" for the present invention and is constructed by housing a circuit board 2 in a casing 3 and attaching a fan (not illustrated) for cooling electronic components mounted on the circuit board 2 to the casing 3.

The circuit board 2 is a substrate with mounted electronic components (a power supply circuit-mounted substrate) which is one example of a "circuit board" for the present invention, and has a various electronic components such as capacitors 11 and busbars 12 and 13 (see FIGS. 2 to 4) mounted on a component mounting surface Fa of a base substrate 10 (one example of a "base substrate" for the present invention). Note that for ease of understanding the characteristics of the circuit board 2 (the power supply apparatus 1), component elements aside from the base substrate 10, the capacitors 11, and the busbars 12 and 13 have been omitted from FIGS. 2 to 4.

Figure 3:
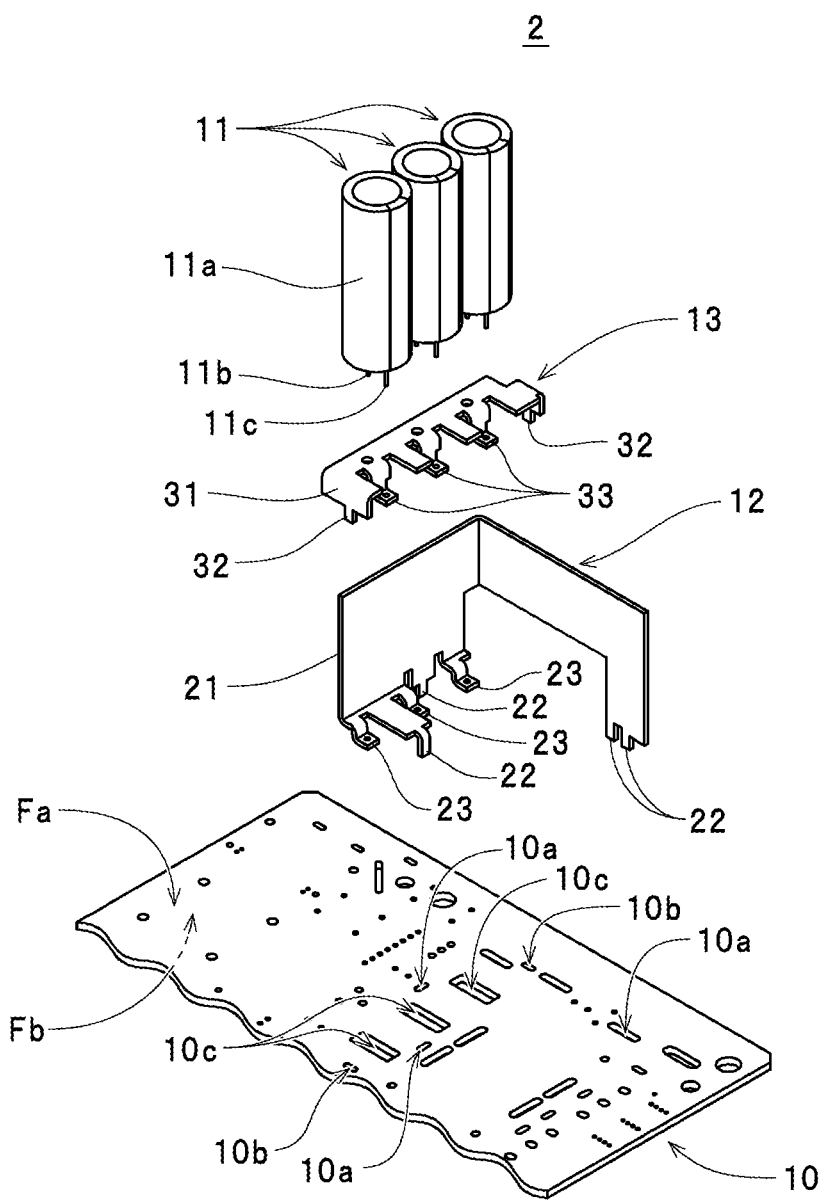
FIG. 3 is an exploded perspective view of the circuit board depicted in FIG. 2.
Figure 4:
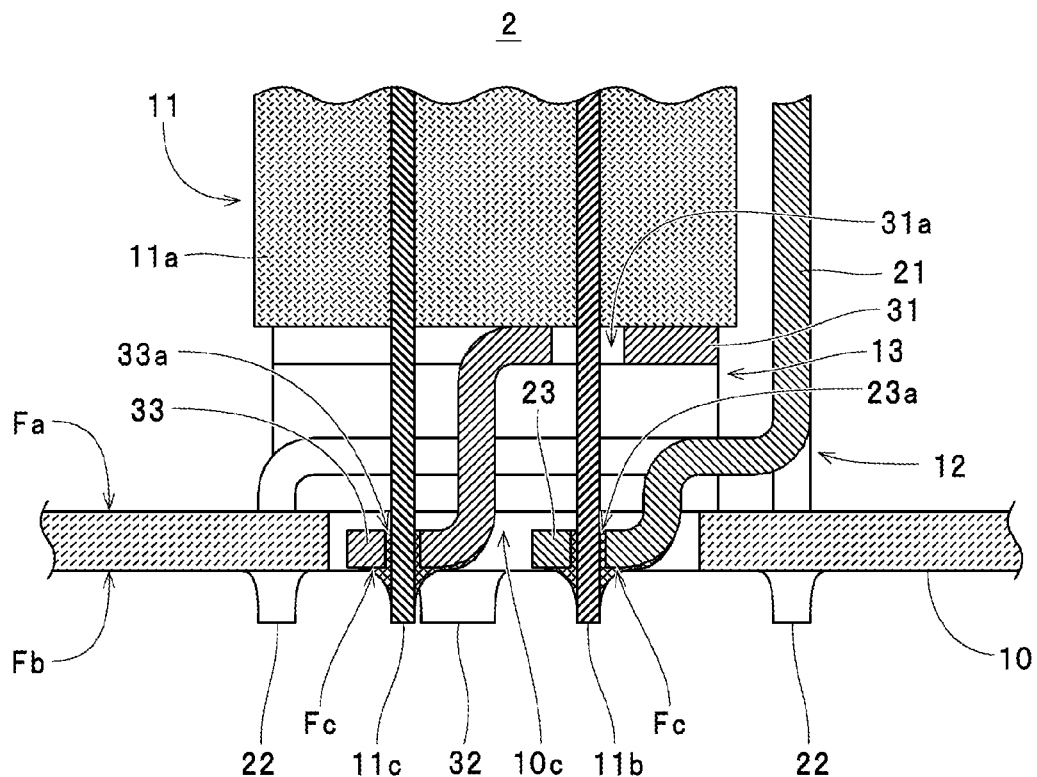
FIG. 4 is a cross-sectional view of the circuit board depicted in FIG. 2.

The capacitors 11 are one example of "electronic components" and are mounted via the busbars 12 and 13 on the component mounting surface Fa side of the base substrate 10. As depicted in FIGS. 3 and 4, each capacitor 11 has a connection terminal 11b (positive electrode terminal) and a connection terminal 11c (negative electrode terminal), which are an example of a "plurality of connection terminals" for the present invention and project downward from the bottom surface of the main body 11a. Note that the internal configurations of the main bodies 11a of the capacitors 11 have been omitted from FIG. 4.

Figure 2:
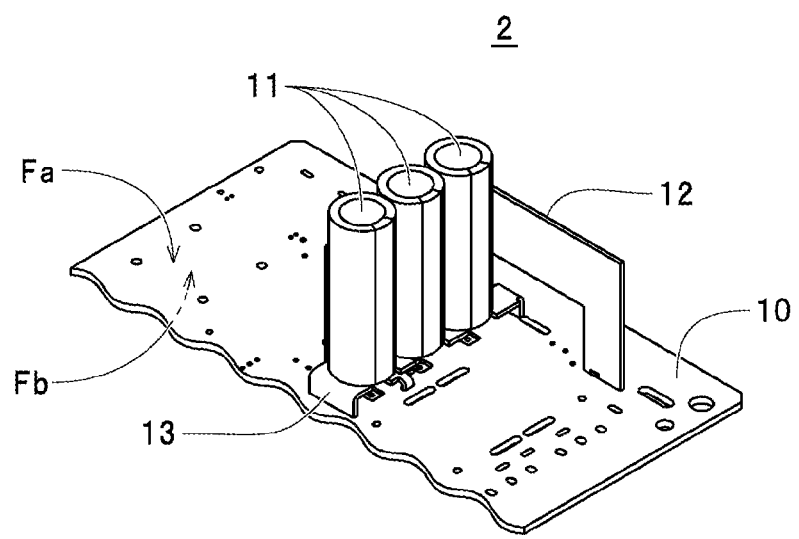
FIG. 2 is a perspective view of a circuit board where component elements aside from a base substrate, capacitors, and busbars are not illustrated.

The busbars 12 and 13 are an example of a "first busbar" and a "second busbar" for the present invention and, as depicted in FIG. 2, are mounted together with the capacitors 11 on the component mounting surface Fa side of the base substrate 10. With the circuit board 2 according to the present embodiment, as one example, as depicted in FIG. 3, fixing protruding portions 22 for fixing the busbar 12 to the base substrate 10 and component connecting end portions 23 for connecting the connection terminals 11b of the capacitors 11 are provided on the busbar 12 so as to extend from a base portion 21. In addition, with the circuit board 2 according to the present embodiment, fixing protruding portions 32 for fixing the busbar 13 to the base substrate 10 and component connecting end portions 33 for connecting the connection terminals 11c of the capacitors 11 are provided on the busbar 13 so as to extend from a base portion 31.

Figure 5:
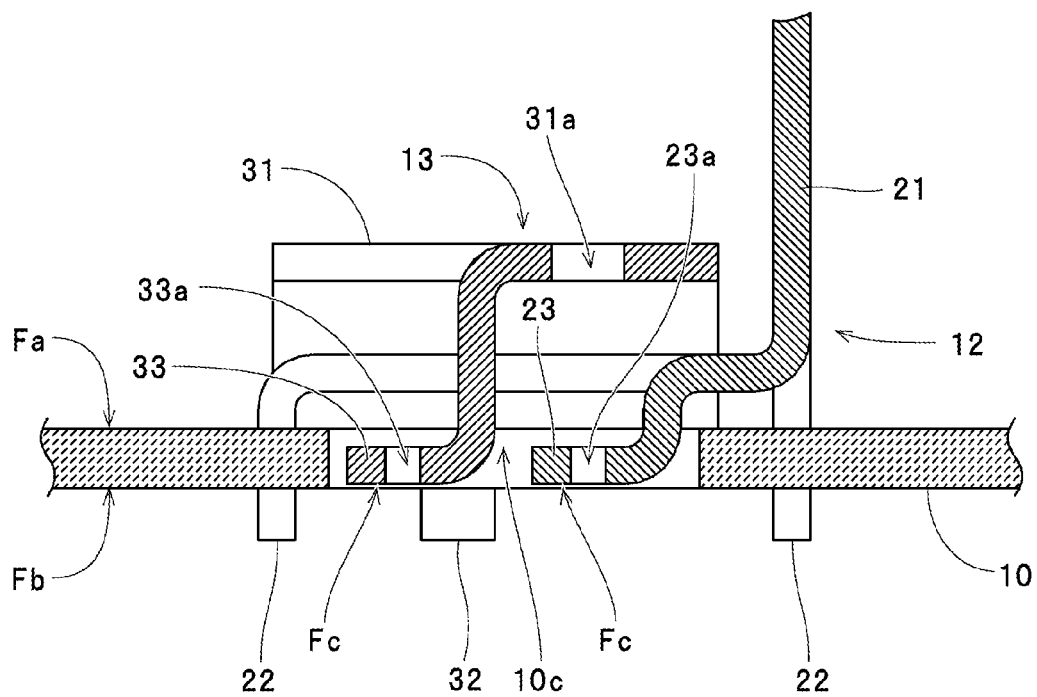
FIG. 5 is a cross-sectional view of a base substrate and busbars that is useful in explaining a method of manufacturing the circuit board.

Also, as depicted in FIGS. 4 and 5, an insertion hole 23a that is one example of a "first insertion portion" is provided in each component connecting end portion 23 of the busbar 12 and an insertion hole 33a that is one example of another "first insertion portion" is provided in each component connecting end portion 33 of the busbar 13. Here, as depicted in FIG. 3, the component connecting end portions 23 and 33 are formed so as to strap-like in form (when viewed from above) with a sufficient width for soldering the connection terminals 11b and 11c, and, as depicted in FIG. 4, are bent so that in a state where the busbars 12 and 13 have been fixed to the base substrate 10, soldering surfaces Fc (surfaces where the connection terminals 11b and 11c that have been inserted through the insertion holes 23a and 33a protrude, i.e., surfaces where the connection terminals 11b and 11c that have been inserted through the insertion holes 23a and 33a are soldered from a rear surface Fb side of the base substrate 10) are parallel with the component mounting surface Fa and the rear surface Fb of the base substrate 10.

In addition, as depicted in FIGS. 4 and 5, insertion holes 31a that are one example of "second insertion portions" are provided in the base portion 31 of the busbar 13. Here, the insertion holes 31a are formed with a size that enables the connection terminals 11b to be connected to the component connecting end portions 23 of the busbar 12 to pass through the busbar 13 without contacting the busbar 13 (an example configuration where the busbar 13 is "one out of the first busbar and the second busbar" and the busbar 12 is the "other out of the first busbar and the second busbar").

Also, as depicted in FIG. 3, with the circuit board 2 according to the present embodiment, insertion holes 10a through which the fixing protruding portions 22 of the busbar 12 can be inserted, insertion holes 10b through which the fixing protruding portions 32 of the busbar 13 can be inserted, and insertion holes 10c through which the component connecting end portions 23 and 33 of the busbars 12 and 13 can be inserted are provided in the base substrate 10. Here, the insertion holes 10c are one example of "opening portions" for the present invention and as depicted in FIG. 4, each insertion hole 10c is formed with a size that enables a pair of component connecting end portions 23 and 23, which become adjacently disposed in keeping with the positions of the connection terminals 11b and 11c of each capacitor 11, to be inserted together.

When manufacturing the power supply apparatus 1, the circuit board 2 is manufactured first. More specifically, various component elements that construct a power supply circuit are mounted on the component mounting surface Fa side of the base substrate 10. Note that for ease of understanding the configuration and method of manufacturing the circuit board 2 (the power supply apparatus 1), detailed description of component elements aside from the capacitors 11 and the busbars 12 and 13 is omitted.

First, the fixing protruding portions 22 are respectively inserted into the insertion holes 10a of the base substrate 10 to dispose the busbar 12 on the component mounting surface Fa side of the base substrate 10. At this time, as depicted in FIG. 5, a state is produced where component connecting end portions 23 are inserted inside the insertion holes 10c of the base substrate 10 and the soldering surfaces Fc of the component connecting end portions 23 are positioned closer to the rear surface Fb than the component mounting surface Fa of the base substrate 10 (in the present embodiment, the soldering surfaces Fc are positioned "between the component mounting surface Fa and the rear surface Fb", "inside the insertion holes 10a", and "within the thickness in the base substrate 10").

Next, the fixing protruding portions 32 are respectively inserted into the insertion holes 10b of the base substrate 10 to dispose the busbar 13 on the component mounting surface Fa side of the base substrate 10. At this time, as depicted in FIG. 5, a state is produced where the component connecting end portions 33 are inserted inside the insertion holes 10c of the base substrate and the soldering surfaces Fc of the component connecting end portions 33 are aligned with the soldering surfaces Fc of the component connecting end portions 23 of the busbar 12 and positioned closer to the rear surface Fb than the component mounting surface Fa of the base substrate 10 (in the present embodiment, the soldering surfaces Fc are positioned between the component mounting surface Fa and the rear surface Fb (inside the insertion holes 10a)).

Also, in a state where the busbars 12 and 13 have been disposed on the component mounting surface Fa side of the base substrate 10 (a state where the busbars 12 and 13 have been positioned on the base substrate 10 by the fixing protruding portions 22 and 32 and the insertion holes 10a and 10b), as depicted in FIG. 5, the insertion holes 23a of the busbar 12 and the insertion holes 31a of the busbar 13 become coincident in the thickness direction of the base substrate 10 (a direction perpendicular to the component mounting surface Fa and the rear surface Fb: the up-down direction in FIG. 5).

After this, the capacitors 11 are positioned above the component connecting end portions 23 and 33 of the busbars 12 and 13. More specifically, the connection terminals 11b that have been inserted through the insertion holes 31a of the busbar 13 are inserted through the insertion holes 23a of the component connecting end portions 23 and the connection terminals 11c are inserted through the insertion holes 33a of the component connecting end portions 33 of the busbar 13.

At this time, as depicted in FIG. 4, a state is produced where the bottom surface of the main body 11a of each capacitor 11 contacts the formation position of an insertion hole 31a on the base portion 31 of the busbar 13, resulting in a state where the busbar 13 functions as a pedestal and the capacitors 11 (the main bodies 11a) are supported by the busbar 13. By doing so, as described later, in a state where soldering has been completed, it is possible to favorably avoid a situation where the weight of the main body 11a and external forces applied to the main body 11a (for example, a force that presses a heat sink or the like onto the main body 11a) act upon only the connection terminals 11b and 11c and cause deformation in the connection terminals 11b and 11c.

Next, component elements aside from the capacitors 11 and the busbars 12 and 13 are disposed on the component mounting surface Fa and the rear surface Fb of the base substrate 10 in this state is dipped in solder in a solder dip tank (i.e., dip soldering is performed). At this time, as depicted in FIG. 4, connection terminals and/or fixing protrusions (not illustrated) of the respective component elements are soldered to the base substrate 10, and together with this, the fixing protruding portions 22 and 32 are soldered to the base substrate 10 to fix the busbars 12 and 13 to the base substrate 10 and the connection terminals 11b and 11c are soldered to the component connecting end portions 23 and 33 so as to become connected to the busbars 12 and 13, respectively.

Here, with the circuit board 2 (the power supply apparatus 1) according to the present embodiment, as described earlier, in a state where the busbars 12 and 13 have been disposed on the component mounting surface Fa side of the base substrate 10, the soldering surfaces Fc of the component connecting end portions 23 and 33 become positioned closer to the rear surface Fb side than the component mounting surface Fa of the base substrate 10. Accordingly, regardless of whether the thickness of the base substrate 10 has been made sufficiently thick to sufficiently increase the physical strength, when the rear surface Fb of the base substrate 10 is dipped in solder in a dip tank during dip soldering, a sufficient amount of solder will be supplied to the soldering surfaces Fc of the component connecting end portions 23 and 33 positioned near the rear surface Fb and to the connection terminals 11b and 11c that have been inserted through the insertion holes 23a and 33a and protrude downward from the soldering surfaces Fc. With the solder supplied in this way, as depicted in FIG. 4, the connection terminals 11b are reliably soldered to the component connecting end portions 23 of the busbar 12 and the connection terminals 11c are reliably soldered to the component connecting end portions 33 of the busbar 13.

Also, with the circuit board 2 (the power supply apparatus 1) according to the present embodiment, as described earlier, the component connecting end portions 23 and 33 are formed so as to be strap-like in form (when viewed from above) with a sufficient width for soldering the connection terminals 11b and 11c. Accordingly, when the component connecting end portions 23 and 33 come into contact with the solder, it is difficult for heat to be conducted away from the component connecting end portions 23 and 33 to the base portions 21 and 31, so that the temperature of the component connecting end portions 23 and 33 rises in a short time to a temperature at which solder favorably adheres to the soldering surfaces Fc. By doing so, the connection terminals 11b and 11c can be quickly and reliably soldered to the component connecting end portions 23 and 33 (i.e., the components can be favorably joined).

After this, by assembling the casing 3 by connecting the fan attached to the casing 3 to the circuit board 2 and housing the circuit board 2 inside the casing 3, the power supply apparatus 1 is completed as depicted in FIG. 1.

In this way, with the circuit board 2, the insertion holes 10c into which the component connecting end portions 23 and 33 of the busbars 12 and 13 can be inserted are provided in the base substrate 10 and the busbars 12 and 13 are fixed to the base substrate 10 in a state where the component connecting end portions 23 and 33 have been inserted into the insertion holes 10c so that the soldering surfaces Fc of the component connecting end portions 23 and 33 are positioned closer to the rear surface Fb side than the component mounting surface Fa. Also, the power supply apparatus 1 is configured so as to include the circuit board 2 described above.

Accordingly, according to the circuit board 2 and the power supply apparatus 1, even when the thickness of the base substrate 10 has been made sufficiently thick to ensure sufficient physical strength, by positioning the soldering surfaces Fc of the component connecting end portions 23 and the component connecting end portions 33 closer to the rear surface Fb side than the component mounting surface Fa of the base substrate 10, it is possible, without forming excessively large "opening portions", to reliably supply a sufficient amount of solder to the connection terminals 11b and 11c that have been inserted through the insertion holes 23a and 33a and the soldering surfaces Fc of the component connecting end portions 23 and 33. By doing so, it is possible to quickly and reliably solder the connection terminals 11b and 11c to the component connecting end portions 23 and 33 without causing a drop in the physical strength of the base substrate 10, and as a result, it is possible to supply the circuit board 2 and the power supply apparatus 1 where the connection terminals 11b and 11c have been reliably soldered. Since large "opening portions" are unnecessary, there is a corresponding increase in the area of the region where it is possible to form wiring patterns on the base substrate 10, which means that it is also possible to sufficiently miniaturize the base substrate 10 (the circuit board 2).

In addition, according to the circuit board 2 and the power supply apparatus 1, by providing the insertion holes 31a in the busbar 13 and inserting the connection terminals 11b that to be soldered to the component connecting end portions 23 of the busbar through such insertion holes 31a of the busbar 13, it is possible to dispose the busbars 12 and 13 so that the peripheries of the insertion holes 23a of the component connecting end portions 23 of the busbar 12 and the periphery of the insertion holes 31a of the base portion 31 of the busbar 13 are coincident in the thickness direction of the base substrate 10, which means that it is possible to make effective use of the mounting area of the base substrate 10 and as a result, it is possible to significantly miniaturize the base substrate 10 (the circuit board 2).

Note that the configurations of the "circuit board" and the "power supply apparatus" are not limited to the configurations of the circuit board 2 and the power supply apparatus 1 described above. As one example, although an example where the busbars 12 and 13 are fixed to the base substrate 10 in a state where the component connecting end portions 23 and 33 are inserted into the insertion holes 10c so that the soldering surfaces Fc are positioned between the component mounting surface Fa and the rear surface Fb of the base substrate 10 (within the thickness of the base substrate 10) has been described above, it is also possible to fix the "busbars" to the base substrate 10 in a state where "component connecting end portions" are inserted into the insertion holes 10c so that the "soldering surfaces" are positioned below the rear surface Fb of the base substrate 10 (i.e., so that the component connecting end portions protrude beyond the rear surface Fb). When such configuration is used, it is also possible to quickly and reliably solder the connection terminals 11b, and 11c to the "component connecting end portions".

Also, although a configuration has been described where the insertion holes 10c, into which the component connecting end portions 23 of the busbar 12 and the component connecting end portions 33 of the busbar 13 can be inserted together, are provided as "opening portions" in the base substrate 10, when the "component connecting end portions" of the "first busbar" and the "component connecting end portions" of the "second busbar" are a certain distance apart, or in other words, when large "electronic components" whose "connection terminals" to be soldered to the two "busbars" are separated by a large distances are soldered to both "busbars", it is possible to use a configuration where the "base substrate" is separately and independently provided with "opening portions" for inserting the "component connecting end portions" of the "first busbar" and "opening portions" for inserting the "component connecting end portions" of the "second busbar".

Also, the form of the "opening portions" is not limited to holes like the insertion holes 10c, and when "opening portions" are provided near an outer edge portion of the "base substrate", it is also possible to provide "opening portions" in the form of cutaways produced by cutting away from an outer edge portion of the "base substrate" toward an inner region. Similarly, the form of the "first insertion portions" and the "second insertion portions" is not limited to holes like the insertion holes 23a and 33a and the insertion holes 31a, and may be cutaways.

The expression "electronic components" to be soldered to the "busbars" is not limited to capacitors like the capacitors 11 in the example described above and includes various electronic components such as inductors and diodes. Here, the number of "connection terminals" of an "electronic component" to be soldered to a "busbar" is not limited to two and it is also possible to configure a "circuit board" by soldering "electronic components" equipped with a plurality of (i.e., three or more) "connection terminals" to the "busbars". In addition, although a configuration where two busbars 12 and 13 are provided has been described as an example, it is also possible to configure a "circuit board" equipped with a plurality of (i.e., three or more) "busbars".

Also, although a circuit board 2 that constructs the power supply apparatus 1 has been described as an example, the expression "circuit board" is not limited to a "power supply circuit-mounted substrate" like the circuit board 2 and further includes electronic component-mounted substrates that construct various circuits for other uses. In addition, although an example where connection terminals are soldered to "component connecting end portions" of "busbars" by dip soldering has been described, the soldering method is not limited to dip soldering and when soldering by way of a manual operation using a soldering iron, by using a configuration where the "soldering surfaces" of the "component connecting end portions" of the "busbars" are positioned closer to the "rear surface" side than the "component mounting surface" of the "base substrate", it is possible to solder the "connection terminals" to the "component connecting end portions" quickly, reliably, and easily.

What is claimed is:
1. A circuit board comprising:
a base substrate;
a busbar disposed on a component mounting surface of the base substrate; and
an electronic component that is disposed on the component mounting surface of the base substrate and has a plurality of connection terminals, at least one of the connection terminals is soldered to a component connecting end portion that extends from a base portion of the busbar, wherein the base substrate is provided with an opening portion into which the component connecting end portion is capable of being inserted, a first insertion portion is provided in the component connecting end portion, and the connection terminal is inserted through the first insertion portion, and the busbar is fixed to the base substrate so that the component connecting end portion is inserted into the opening portion with a soldering surface positioned closer to a rear surface side of the base substrate than the component mounting surface of the base substrate, and the soldering surface is located on a side of the component connecting end portion where the terminal inserted through the first insertion portion protrudes.

2. The circuit board according to claim 1, wherein the busbar includes a first busbar that has one out of the plurality of connection terminals of the electronic component soldered to the component connecting end portion and a second busbar that has another out of the plurality of connection terminals soldered to the component connecting end portion, wherein a second insertion portion is provided on one out of the first busbar and the second busbar, with the other connection terminal to be soldered to the component connecting end portion being inserted through the second insertion portion.

3. A power supply apparatus comprising the circuit board according to claim 1.

4. A power supply apparatus comprising the circuit board according to claim 2.

* * * * *